United States Patent
Chen et al.

(10) Patent No.: US 10,199,258 B2
(45) Date of Patent: Feb. 5, 2019

(54) METHOD OF FABRICATING ISOLATION STRUCTURE

(71) Applicants: United Microelectronics Corp., Hsinchu (TW); Fujian Jinhua Integrated Circuit Co., Ltd., Fujian province (CN)

(72) Inventors: Chieh-Te Chen, Kaohsiung (TW); Hsien-Shih Chu, Kaohsiung (TW); Ming-Feng Kuo, Tainan (TW); Fu-Che Lee, Taichung (TW); Chien-Ting Ho, Taichung (TW); Chiung-Lin Hsu, Tainan (TW); Feng-Yi Chang, Tainan (TW); Yi-Wang Zhan, Taichung (TW); Li-Chiang Chen, Tainan (TW); Chien-Cheng Tsai, Kaohsiung (TW); Chin-Hsin Chiu, Tainan (TW)

(73) Assignees: United Microelectronics Corp., Hsinchu (TW); Fujian Jianhua Integrated Circuit Co., Ltd., Fujian Province (CN)

( * ) Notice: Subject to any disclaimer, the term of this patent is extended or adjusted under 35 U.S.C. 154(b) by 0 days.

(21) Appl. No.: 15/384,940

(22) Filed: Dec. 20, 2016

(65) Prior Publication Data
US 2018/0108563 A1   Apr. 19, 2018

(30) Foreign Application Priority Data
Oct. 17, 2016   (CN) .......................... 2016 1 0903787

(51) Int. Cl.
H01L 21/762 (2006.01)
H01L 21/308 (2006.01)

(52) U.S. Cl.
CPC .... H01L 21/76224 (2013.01); H01L 21/3081 (2013.01); H01L 21/762 (2013.01)

(58) Field of Classification Search
CPC ....... H01L 2924/0002; H01L 21/31144; H01L 21/0337; H01L 2924/00; H01L 21/76816; H01L 21/28273
See application file for complete search history.

(56) References Cited

U.S. PATENT DOCUMENTS

8,318,603 B2   11/2012   Lee et al.
8,580,692 B2   11/2013   Arnold et al.

*Primary Examiner* — Tony Tran
(74) *Attorney, Agent, or Firm* — J.C. Patents (57) ABSTRACT

A method of fabricating an isolation structure is provided. A first oxide layer and a first, second, and third hard mask layers are formed on a substrate. A patterned third hard mask layer is formed. Second oxide layers are formed on sidewalls of the patterned third hard mask layer and a fourth hard mask layer is formed between the second oxide layers. The second oxide layers and the second hard mask layer are removed using the patterned third hard mask layer and the fourth hard mask layer as a mask, to form a patterned second hard mask layer. The patterned third hard mask layer and the fourth hard mask layer are removed. A portion of the patterned second hard mask layer is removed to form trench patterns. A patterned first hard mask layer and first oxide layer, and trenches located in the substrate are defined. An isolation material is formed.

1 Claim, 11 Drawing Sheets

METHOD OF FABRICATING ISOLATION STRUCTURE

CROSS-REFERENCE TO RELATED APPLICATION

This application claims the priority benefit of China patent application serial no. 201610903787.1, filed on Oct. 17, 2016. The entirety of the above-mentioned patent application is hereby incorporated by reference herein and made a part of the specification.

BACKGROUND OF THE INVENTION

Field of the Invention

The invention relates to a method of fabricating a semiconductor device, and particularly relates to a method of fabricating an isolation structure.

Description of Related Art

To achieve high density and high performance goals with an increased degree of integration of a semiconductor device, it is preferable to manufacture a structure having a smaller size and a higher degree of integration when manufacturing the semiconductor device. At this time, a pattern density on a substrate will have a certain effect on the manufacturing process.

For example, when forming an isolation structure in the substrate, trenches are formed in the substrate first, and then an isolation material is filled in the trenches. However, when the trenches in the substrate have different widths, it will cause the pattern density to be non-uniform. Therefore, after filling the isolation material in the trenches, the height difference of the surface on the substrate is often caused thereby. That is, the substrate can not have a flat profile, thereby affecting the subsequent manufacturing process.

SUMMARY OF THE INVENTION

The invention provides a method of fabricating an isolation structure, which enables a substrate to have a flat or substantially flat profile.

The method of fabricating the isolation structure of the invention includes the following steps. A first oxide layer, a first hard mask layer, a second hard mask layer, and a third hard mask layer are sequentially formed on a substrate. A patterned third hard mask layer is formed, so as to expose a surface of the second hard mask layer. Second oxide layers are formed on sidewalls of the patterned third hard mask layer and a fourth hard mask layer is formed between the second oxide layers. The second oxide layers and the second hard mask layer thereunder are removed using the patterned third hard mask layer and the fourth hard mask layer as patterning masks, so as to form a patterned second hard mask layer. The patterned third hard mask layer and the fourth hard mask layer are removed. A portion of the patterned second hard mask layer is removed, so as to form trench patterns with different widths. A patterned first hard mask layer, a patterned first oxide layer, and trenches with different widths located in the substrate are defined using the patterned second hard mask layer as a patterning mask. The patterned second hard mask layer, the patterned first hard mask layer, and the patterned first oxide layer are removed. An isolation material is formed in the trenches.

According to an embodiment of the invention, the first hard mask layer is an amorphous silicon layer, for example. The second hard mask layer is an oxide layer, for example. The third hard mask layer includes an organic dielectric layer (ODL) and a silicon-containing hard-mask bottom anti-reflective coating (SHB) sequentially stacked. The fourth hard mask layer is an organic dielectric layer, for example.

According to an embodiment of the invention, the first hard mask layer is an amorphous silicon layer, for example. The second hard mask layer is an oxide layer, for example. The third hard mask layer includes an amorphous carbon layer, a dielectric anti-reflection coating (DARC), and a bottom anti-reflective coating (BARC) sequentially stacked. The fourth hard mask layer is an organic dielectric layer.

According to an embodiment of the invention, the first hard mask layer is an amorphous silicon layer, for example. The second hard mask layer is a nitride layer, for example. The third hard mask layer includes an organic dielectric layer and a silicon-containing hard-mask bottom anti-reflective coating sequentially stacked. The fourth hard mask layer is an organic dielectric layer, for example.

The method of fabricating the isolation structure of the invention includes the following steps. A first oxide layer, a first hard mask layer, a second hard mask layer, a third hard mask layer, a fourth hard mask layer, and a fifth hard mask layer are sequentially formed on a substrate. A patterned fifth hard mask layer is formed, so as to expose a surface of the fourth hard mask layer. Second oxide layers are formed on sidewalls of the patterned fifth hard mask layer and a sixth hard mask layer is formed between the second oxide layers. The second oxide layers and the fourth hard mask layer thereunder are removed using the patterned fifth hard mask layer and the sixth hard mask layer as patterning masks, so as to form a patterned fourth hard mask layer. The patterned fifth hard mask layer and the sixth hard mask layer are removed. A portion of the patterned fourth hard mask layer is removed, so as to form trench patterns with different widths. A patterned third hard mask layer, a patterned second hard mask layer, a patterned first hard mask layer, a patterned first oxide layer, and trenches with different widths located in the substrate are defined using the patterned fourth hard mask layer as a patterning mask. The patterned fourth hard mask layer, the patterned third hard mask layer, and the patterned second hard mask layer are removed. An isolation material is formed in the trenches. The patterned first hard mask layer is removed.

According to an embodiment of the invention, the first hard mask layer is a nitride layer, for example. The second hard mask layer is an amorphous carbon layer, for example. The third hard mask layer includes an oxide layer and an amorphous silicon layer sequentially stacked. The fourth hard mask layer is an oxide layer, for example. The fifth hard mask layer includes an organic dielectric layer and a silicon-containing hard-mask bottom anti-reflective coating sequentially stacked. The sixth hard mask layer is an organic dielectric layer, for example.

The method of fabricating the isolation structure of the invention includes the following steps. A first oxide layer, a first hard mask layer, and a second hard mask layer are sequentially formed on a substrate. The second hard mask layer s patterned, so as to form a patterned second hard mask layer. Spacers are formed on sidewalls of the patterned second hard mask layer. The patterned second hard mask layer is removed. A third hard mask layer is formed between the spacers. The spacers are removed. A portion of the third hard mask layer is removed, so as to form a patterned third hard mask layer. The patterned third hard mask layer has trench patterns with different widths. A patterned first hard mask layer, a patterned first oxide layer, and trenches with different widths located in the substrate are defined using the patterned third hard mask layer as a patterning mask. The patterned third hard mask layer, the patterned first hard mask layer, and the patterned first oxide layer are removed. An isolation material is formed in the trenches.

According to an embodiment of the invention, the first hard mask layer is an amorphous silicon layer, for example. The second hard mask layer includes an amorphous carbon layer, a dielectric anti-reflection coating, and a bottom anti-reflective coating sequentially stacked. The third hard mask layer is a nitride layer, for example. After patterning the second hard mask layer and before forming the spacers, the method further includes removing a patterned dielectric anti-reflection coating and a patterned bottom anti-reflective coating.

The method of fabricating the isolation structure of the invention includes the following steps. A first oxide layer, a first hard mask layer, a second hard mask layer, and a third hard mask layer are sequentially formed on a substrate. A patterned third hard mask layer is formed, so as to expose a surface of the second hard mask layer. A portion of the second hard mask layer is removed using the patterned third hard mask layer as a patterning mask, so as to form a patterned second hard mask layer. Second oxide layers are formed on sidewalls of the patterned second hard mask layer and a fourth hard mask layer is formed between the second oxide layers. The second oxide layers are removed. A portion of the patterned second hard mask layer and a portion of the fourth hard mask layer are removed, so as to form trench patterns with different widths. A patterned first hard mask layer, a patterned first oxide layer, and trenches with different widths located in the substrate are defined using the patterned second hard mask layer and the fourth hard mask layer as patterning masks. The patterned second hard mask layer, the fourth hard mask layer, and the patterned first hard mask layer are removed. An isolation material is formed in the trenches.

According to an embodiment of the invention, the first hard mask layer is a nitride layer, for example. The second hard mask layer is an amorphous silicon layer, for example. The third hard mask layer includes an organic dielectric layer and a silicon-containing hard-mask bottom anti-reflective coating sequentially stacked. The fourth hard mask layer is an organic dielectric layer, for example.

Based on the above, in the method of fabricating the isolation structure of the invention, after forming the trenches in the substrate, the substrate can have a flat surface. Thus, after filling the isolation material in the trenches subsequently, the substrate can exhibit a flat or substantially flat appearance, which is conducive to the following manufacturing process.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The following embodiments mainly describe the manufacturing process of an isolation structure (such as a shallow trench isolation structure). After forming the isolation structure, a surface profile of the substrate can exhibit a flat or substantially flat (i.e., a slight difference in height can be ignored) appearance.

FIG. 1A to FIG. 1I are schematic cross-sectional views illustrating a manufacturing process of an isolation structure according to a first embodiment of the invention. First, referring to FIG. 1A, an oxide layer 102 is formed on a substrate 100. If a desired depth of a trench to be etched is 3000 angstroms, a thickness of the oxide layer 102 is preferably greater than 1000 angstroms, such as between 1000 angstroms and 1500 angstroms. The deeper the depth of the trench is, the thicker the thickness of the oxide layer 102 is required. A method of forming the oxide layer 102 is a chemical vapor deposition process, for example. Then, a stacked structure composed of a plurality of hard mask layers is formed on the oxide layer 102. In the embodiment, hard mask layers 104, 106, and 108 are sequentially formed on the oxide layer 102. The substrate 100 is a silicon substrate, for example. A method of forming the hard mask layers 104, 106, and 108 is that different chemical vapor deposition processes are sequentially performed, for example. For two adjacent hard mask layers, during an etching process, an etching rate of the upper hard mask layer is less than an etching rate of the lower hard mask layer. That is, in the patterning process, an upper hard mask layer pattern can be used to define a lower hard mask layer pattern.

Figure 1A:
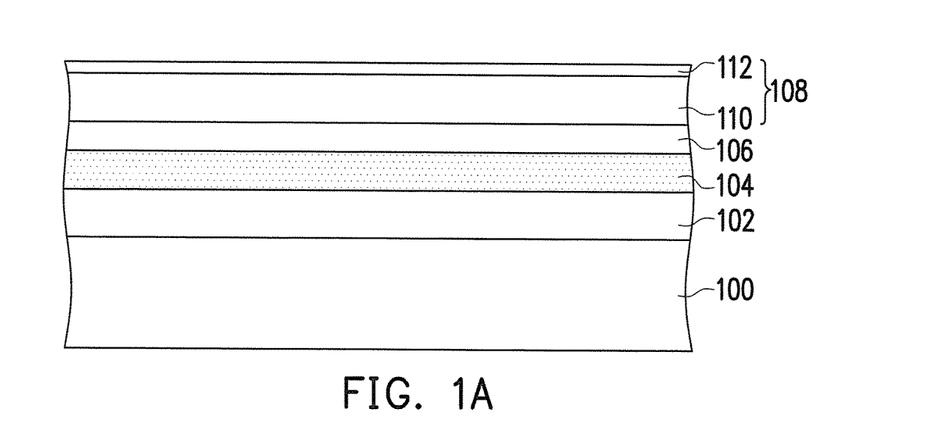
FIG. 1A to FIG. 1I are schematic cross-sectional views illustrating a manufacturing process of an isolation structure according to a first embodiment of the invention.

In the embodiment, the hard mask layer 104 is an amorphous silicon layer, for example, and a thickness thereof is between 500 angstroms and 1000 angstroms, for example. The hard mask layer 106 is an oxide layer, for example, and a thickness thereof is between 300 angstroms and 500 angstroms, for example. The hard mask layer 108 is composed of an organic dielectric layer 110 and a silicon-containing hard-mask bottom anti-reflective coating 112 sequentially stacked, for example.

Figure 1B:
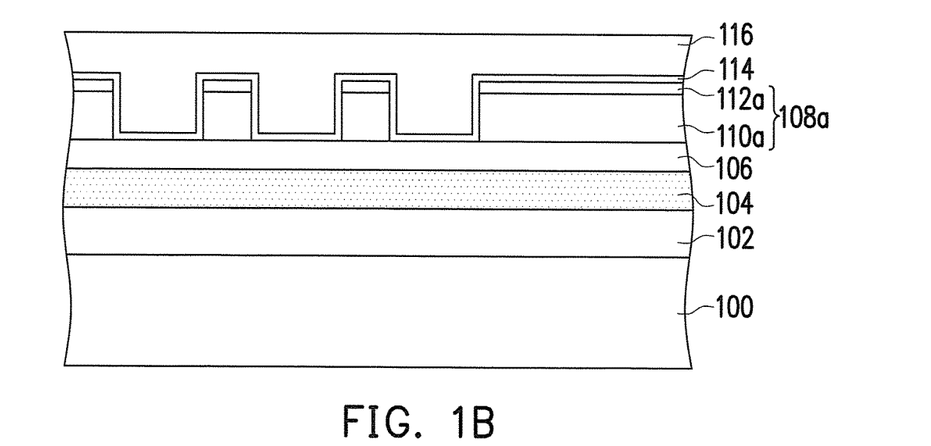

Then, referring to FIG. 1B, a patterning process is performed. The hard mask layer 108 is patterned to form a patterned hard mask layer 108a including a patterned silicon-containing hard-mask bottom anti-reflective coating 112a and a patterned organic dielectric layer 110a, so as to expose a surface of the hard mask layer 106. In the embodiment, a patterned photoresist layer (not shown) is formed on the silicon-containing hard-mask bottom anti-reflective coating 112, and then an etching process is performed to remove the silicon-containing hard-mask bottom anti-reflective coating 112 exposed, so as to form the patterned silicon-containing hard-mask bottom anti-reflective coating 112a. Then, the patterned photoresist layer is removed. Thereafter, an etching process is performed using the patterned silicon-containing hard-mask bottom anti-reflective coating 112a as a patterning mask to remove the organic dielectric layer 110 exposed, so as to form the patterned organic dielectric layer 110a.

Next, an oxide layer 114 is conformally formed on the substrate 100. A method of forming the oxide layer 114 is a chemical vapor deposition process, for example. A thickness of the oxide layer 114 depends on a width of a specific trench subsequently formed in the substrate 100. Then, a dielectric material layer 116, which fills the space exposed by the patterned hard mask layer 108a, is formed on the oxide layer 114. The dielectric material layer 116 is an organic dielectric layer, for example.

Figure 1C:
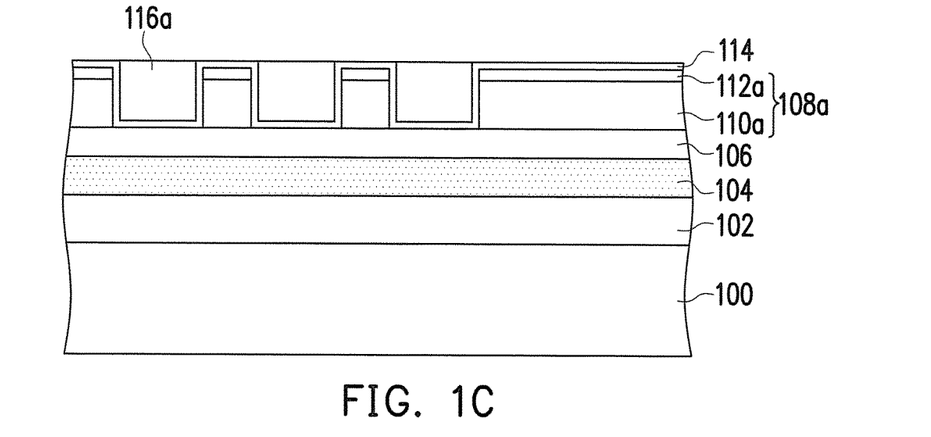

Then, referring to FIG. 1C, an etching process is performed. A portion of the dielectric material layer 116 is removed until the oxide layer 114 on a top surface of the patterned hard mask layer 108a is exposed. The dielectric material layer 116 located in the space exposed by the patterned hard mask layer 108a, which is used as a hard mask layer 116a, is maintained.

Figure 1D:
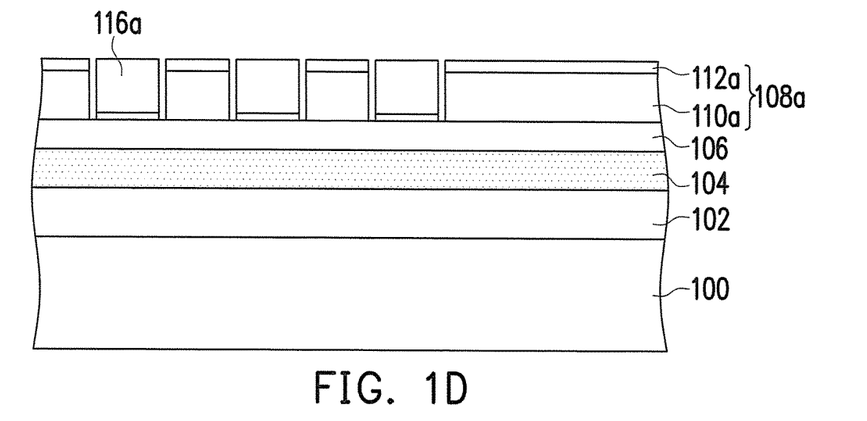

Then, referring to FIG. 1D, a portion of the oxide layer 114 is removed, and the oxide layer 114 located below the hard mask layer 116a is maintained. A method for removing the portion of the oxide layer 114 is an anisotropic etching process, for example.

Figure 1E:
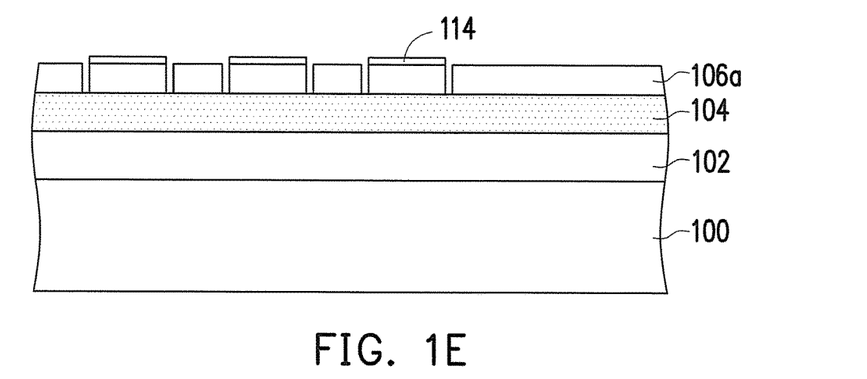

Thereafter, referring to FIG. 1E, an etching process is performed using the patterned hard mask layer 108a and the hard mask layer 116a as a patterning mask to remove a portion of the hard mask layer 106, so as to form a patterned hard mask layer 106a. Next, the patterned hard mask layer 108a and the hard mask layer 116a are removed.

Figure 1F:
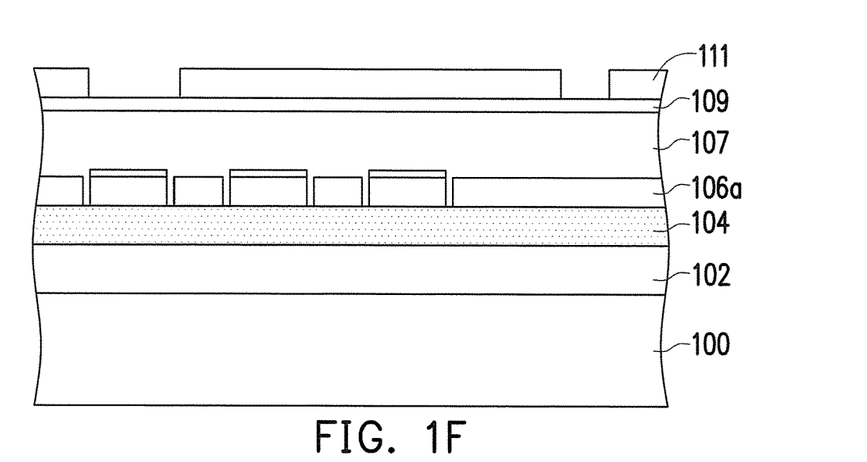

Then, referring to FIG. 1F, an organic dielectric layer 107, a silicon-containing hard-mask bottom anti-reflective coating 109, and a patterned mask layer 111 are sequentially formed on the patterned hard mask layer 106a. The regions exposed by the patterned mask layer 111 correspond to the locations of trenches with a larger width to be formed subsequently.

Figure 1G:
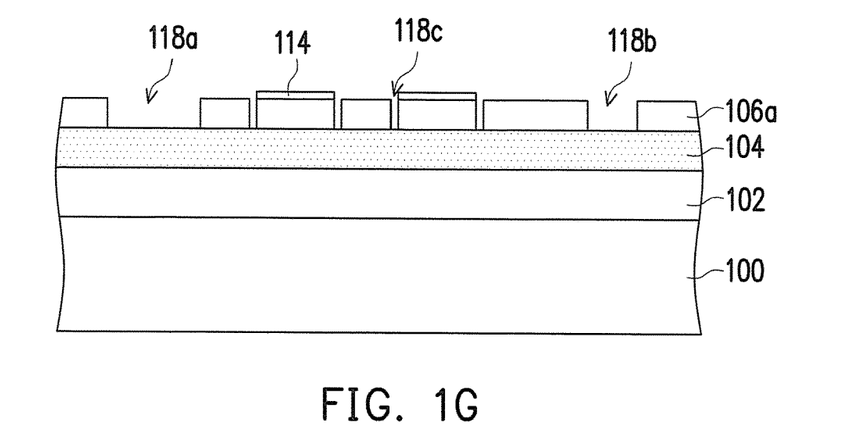

Next, referring to FIG. 1G, an etching process is performed using the patterned mask layer 111 as an etching mask to remove a portion of the silicon-containing hard-mask bottom anti-reflective coating 109, a portion of the organic dielectric layer 107, and a portion of the patterned hard mask layer 106a. Then, the patterned mask layer 111, the remaining silicon-containing hard-mask bottom anti-reflective coating 109, and the remaining organic dielectric layer 107 are removed. Therefore, trench patterns with different widths can be formed in the patterned hard mask layer 106a. Specifically, after the portion of the patterned hard mask layer 106a is removed, trench patterns 118a, 118b, and 118c with different widths are formed, wherein a width of the trench pattern 118a is larger than a width of the trench pattern 118b, and the width of the trench pattern 118b is larger than a width of the trench pattern 118c. The trench patterns correspond to the locations of trenches to be formed in the substrate 100 subsequently.

Figure 1H:
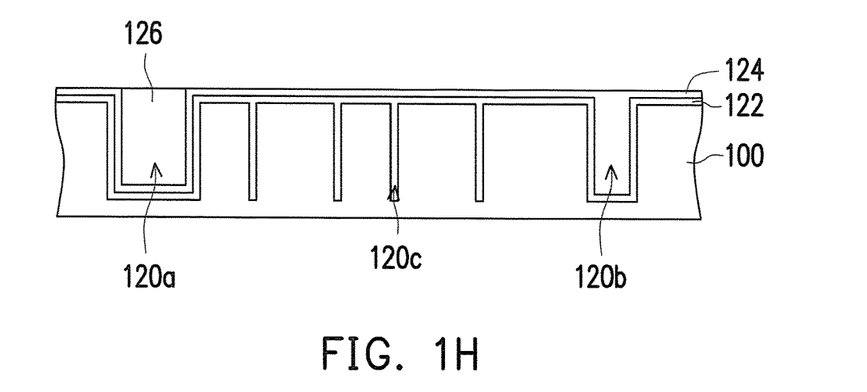

Then, referring to FIG. 1H, an etching process is performed using the patterned hard mask layer 106a as a patterning mask to remove a portion of the hard mask layer 104, so as to form the patterned hard mask layer 104. Next, the patterned hard mask layer 106a is removed. Then, an etching process is performed using the patterned hard mask layer 104 as a patterning mask to remove a portion of the oxide layer 102, so as to form the patterned oxide layer 102. Next, the patterned hard mask layer 104 is removed. Then, an etching process is performed using the patterned oxide layer 102 as a patterning mask to remove a portion of the substrate 100, so as to form trenches 120a, 120b, and 120c with different widths in the substrate 100, wherein the widths of the trenches 120a, 120b, and 120c correspond to the widths of the trench patterns 118a, 118b, and 118c respectively. That is, the width of the trench 120a is larger than the width of the trench 120b, and the width of the trench 120b is larger than the width of the trench 120c. It should be noted that in the aforementioned process of removing the portion of the substrate 100 using the etching process, a portion of the patterned oxide layer 102 is also removed simultaneously, such that the thickness thereof is reduced. Additionally, since there are the trench patterns 118a, 118b, and 118c with different widths on the substrate 100, the etching rate in different regions can be different due to the difference of pattern density. Thus, after the aforementioned etching process is performed, the patterned oxide layer 102 located in the different regions can have different thicknesses.

Next, the patterned oxide layer 102 is removed. Therefore, even though the patterned oxide layer 102 located in the different regions has different thicknesses, the substrate 100 having the trenches 120a, 120b, and 120c with different widths can still have a flat surface after removing the patterned oxide layer 102, which is conducive to the following manufacturing process. Then, an isolation material 122 is formed on the substrate 100. The isolation material 122 is an oxide material, for example, and a forming method thereof is a spin coating process or a deposition process, for example. The isolation material 122 covers the substrate 100 and can fill the trench 120c with a smaller width, and is formed on sidewalls and bottom of the trenches 120a and 102b with larger widths. Then, an isolation material 124 is formed on the substrate 100. The isolation material 124 is a nitride material, for example, and a forming method thereof is a spin coating process or a deposition process, for example. The isolation material 124 covers the substrate 100 and can fill the trench 120b, and is forming on the sidewalls and the bottom of the trench 120a. Thereafter, an isolation material 126 is formed on the substrate 100. The isolation material 126 is an oxide material, for example, and a forming method thereof is a spin coating process or a deposition process, for example. The isolation material 126 covers the substrate 100 and can fill the trench 120a. Then, a planarization treatment is performed to remove a portion of the isolation material 126 until the isolation material 124 is exposed. The aforementioned planarization treatment is a chemical mechanical polishing process, for example.

Figure 1I:
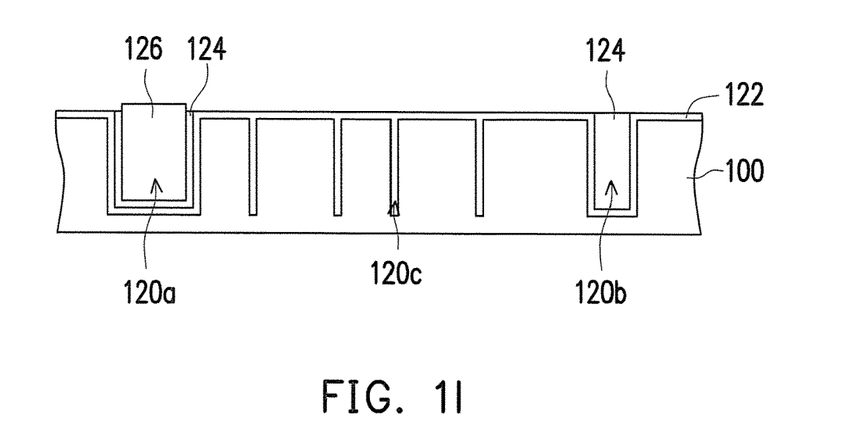

After that, referring to FIG. 1I, an etching process is performed to remove a portion of the isolation material 124, and only the isolation material 124 in the trenches 120a and 120b is maintained. In the embodiment, since the thickness of the isolation material 124 covering on the surface of the substrate 100 is quite thin, the isolation material 126 located in the trench 120a only slightly protrudes from the top surface of the substrate 100 after removing the isolation material 124 on the surface of the substrate 100.

In the aforementioned step, since the substrate 100 has had the flat surface after removing the patterned oxide layer 102, the substrate 100 can exhibit a flat or substantially flat (i.e., a slight difference in height can be ignored) appearance after performing the step of FIG. 1I, which is conducive to the following manufacturing process.

Figure 2:
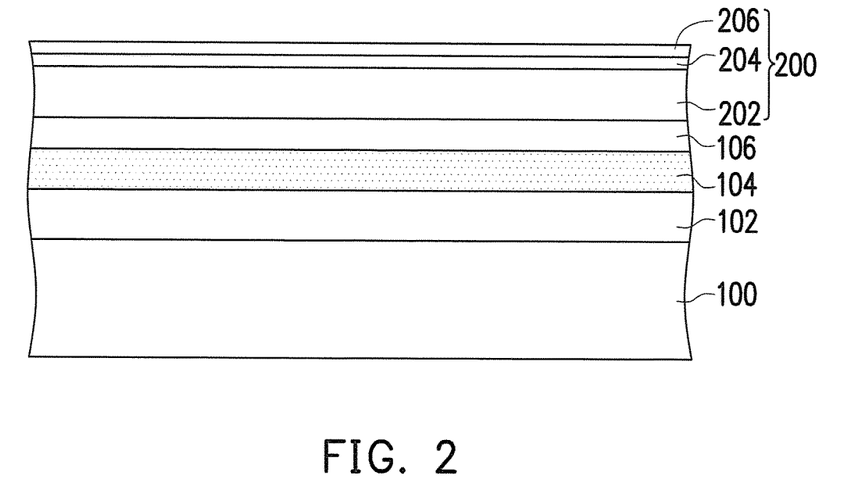
FIG. 2 is a schematic cross-sectional view illustrating a hard mask layer stacked structure formed on a substrate according to a second embodiment of the invention.

FIG. 2 is a schematic cross-sectional view illustrating a hard mask layer stacked structure formed on a substrate according to a second embodiment of the invention. In the embodiment, components the same as that of the first embodiment are represented by the same reference numbers, and are not repeated again. Referring to FIG. 2, the oxide layer 102, hard mask layers 104, 106, and 200 are sequentially formed on the substrate 100. In the embodiment, the hard mask layer 200 is composed of an amorphous carbon layer 202, a dielectric anti-reflection coating 204, and a bottom anti-reflective coating 206 sequentially stacked, for example. The amorphous carbon layer 202 is a commonly used advanced patterning film (APF), for example. Then, the manufacturing process steps as described with reference to FIG. 1B to FIG. 1I can be performed, so as to form the structure as shown in FIG. 1I.

Figure 3:
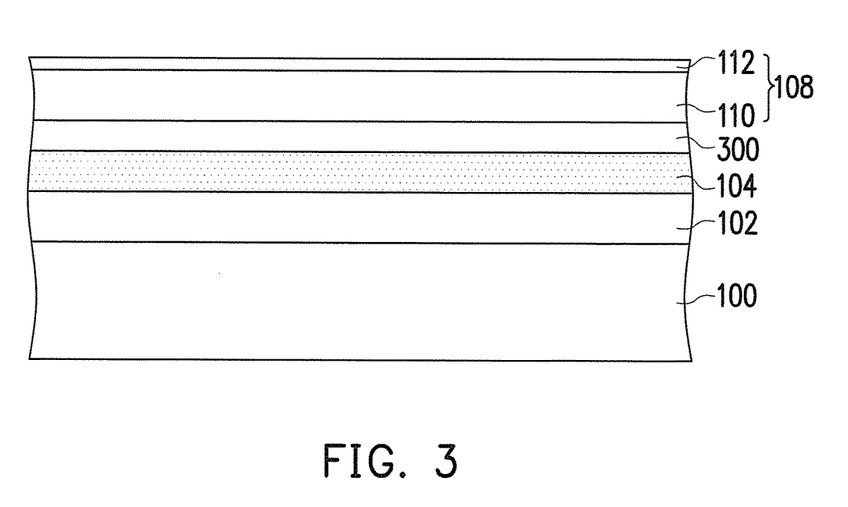
FIG. 3 is a schematic cross-sectional view illustrating a hard mask layer stacked structure formed on a substrate according to a third embodiment of the invention.

FIG. 3 is a schematic cross-sectional view illustrating a hard mask layer stacked structure formed on a substrate according to a third embodiment of the invention. In the embodiment, components the same as that of the first embodiment are represented by the same reference numbers, and are not repeated again. Referring to FIG. 3, the oxide layer 102, hard mask layers 104, 300, and 108 are sequentially formed on the substrate 100. In the embodiment, the hard mask layer 300 is a nitride layer, for example, and a thickness thereof is between 100 angstroms and 500 angstroms, for example. Then, the manufacturing process steps as described with reference to FIG. 1B to FIG. 1I can be performed, so as to form the structure as shown in FIG. 1I.

FIG. 4A to FIG. 4D are schematic cross-sectional views illustrating a manufacturing process of an isolation structure according to a fourth embodiment of the invention. In the embodiment, components the same as that of the first embodiment are represented by the same reference numbers, and are not repeated again.

Figure 4A:
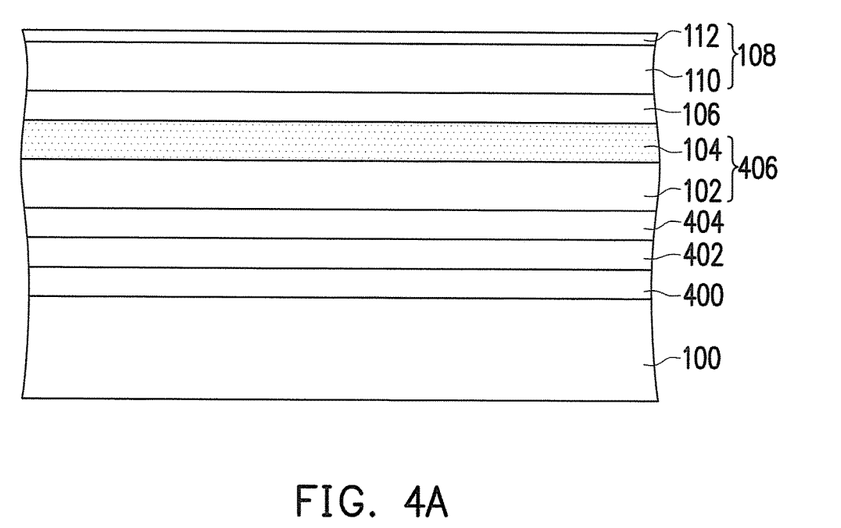
FIG. 4A to FIG. 4D are schematic cross-sectional views illustrating a manufacturing process of an isolation structure according to a fourth embodiment of the invention.

First, referring to FIG. 4A, an oxide layer 400, hard mask layers 402, 404, 406, 106, and 108 are sequentially formed on the substrate 100. The hard mask layer 402 is a nitride layer, for example. The hard mask layer 404 is an amorphous carbon layer, for example. The hard mask layer 406 is composed of the oxide layer 102 and the hard mask layer 104 sequentially stacked, for example.

Figure 4B:
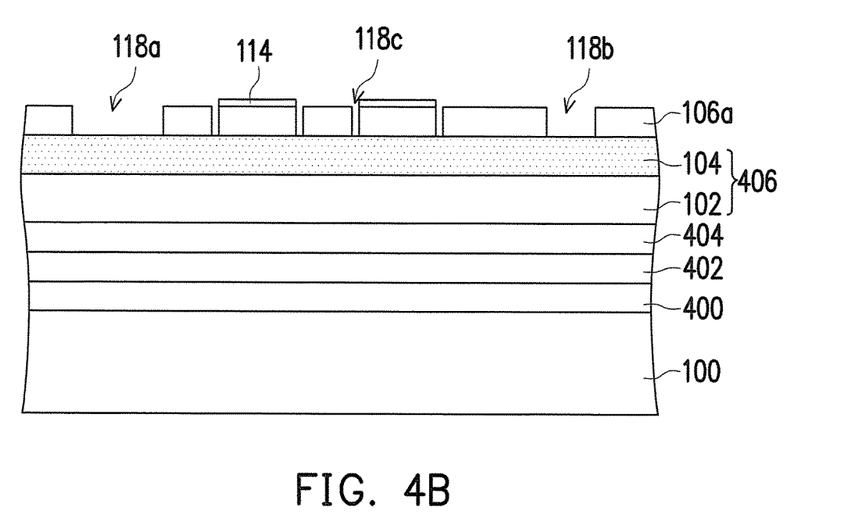

Then, referring to FIG. 4B, the manufacturing process steps as described with reference to FIG. 1B to FIG. 1G are performed. The patterned hard mask layer 106a and the trench patterns 118a, 118b, and 118c with different widths are formed on the hard mask layer 406.

Figure 4C:
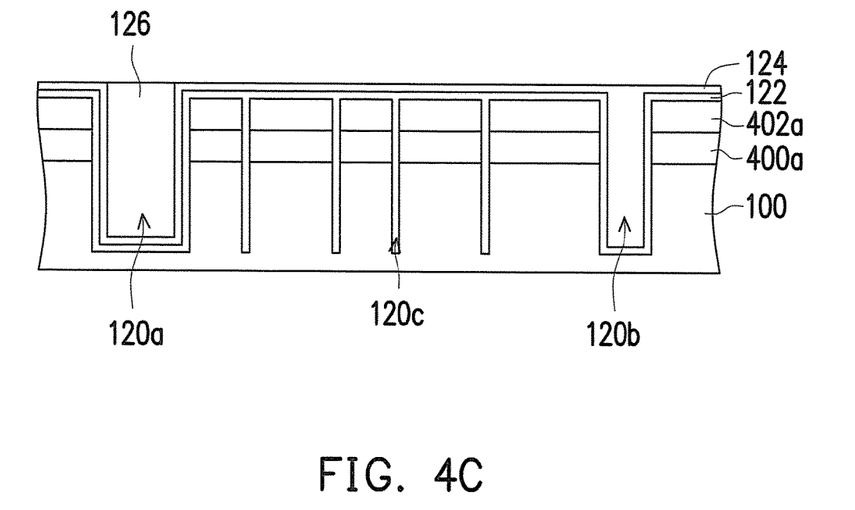

Then, referring to FIG. 4C, an etching process is performed using the patterned hard mask layer 106a as a patterning mask to remove the portion of the hard mask layer 104, so as to form the patterned hard mask layer 104. Next, the patterned hard mask layer 106a is removed. Then, an etching process is performed using the patterned hard mask layer 104 as a patterning mask to remove the portion of the oxide layer 102, so as to form the patterned oxide layer 102. Next, the patterned hard mask layer 104 is removed. Then, an etching process is performed using the patterned oxide layer 102 as a patterning mask to remove a portion of the hard mask layer 404, so as to form the patterned hard mask layer 404. Next, the patterned oxide layer 102 is removed. Then, an etching process is performed using the patterned hard mask layer 404 as a patterning mask to remove a portion of the hard mask layer 402, a portion of the oxide layer 400, and a portion of the substrate 100, so as to form a patterned hard mask layer 402a and a patterned oxide layer 400a, and form the trenches 120a, 120b, and 120c with different widths in the substrate 100.

It should be noted that in the aforementioned process of removing the portion of the hard mask layer 402, the portion of the oxide layer 400, and the portion of the substrate 100 in the etching process, a portion of the patterned hard mask layer 404 is also removed simultaneously, such that the thickness thereof is reduced. Additionally, since there are the trench patterns 118a, 118b, and 118c with different widths on the substrate 100, the etching rate in the different regions can be different due to the difference of pattern density. Thus, after the aforementioned etching process is performed, the patterned hard mask layer 404 located in the different regions can have different thicknesses, while the patterned hard mask layer 402a located thereunder can still have a uniform thickness and a flat surface.

Next, the patterned hard mask layer 404 is removed. Therefore, even though the patterned hard mask layer 404 located in the different regions has different thicknesses, the patterned hard mask layer 402a can still have the uniform thickness and the flat surface after removing the patterned hard mask layer 404, which is conducive to the following manufacturing process. Then, the manufacturing process step as described with reference to FIG. 1H is performed to form the isolation materials 122, 124, and 126.

Figure 4D:
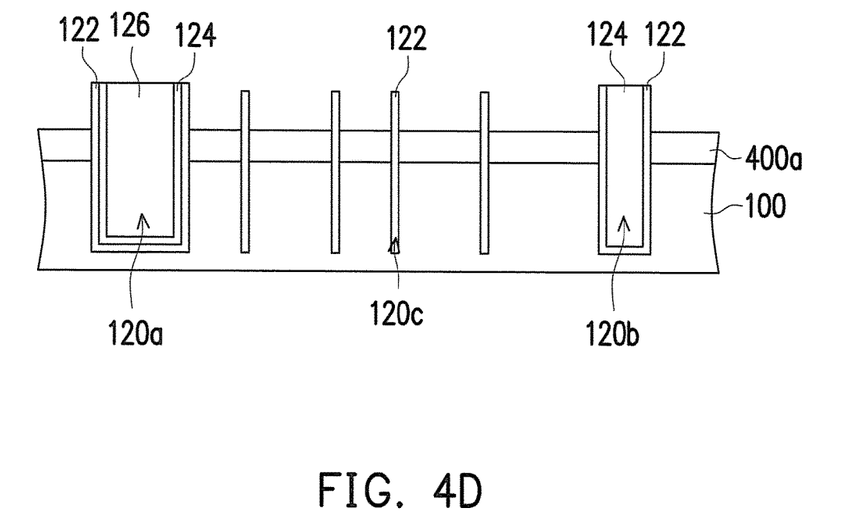

Thereafter, referring to FIG. 4D, an etching process is performed to remove the isolation materials 122, 124, and 126 protruding a top surface of the patterned hard mask layer 402a, so as to form a flat surface. Then, the patterned hard mask layer 402a is removed. Therefore, isolation structures including an isolation structure composed of the isolation materials 122, 124, and 126 located in the trench 120a, an isolation structure composed of the isolation materials 122 and 124 located in the trench 120b, and an isolation structure composed of the isolation material 122 located in the trench 120c protruding the surface of the substrate 100 can be formed.

FIG. 5A to FIG. 5E are schematic cross-sectional views illustrating a manufacturing process of an isolation structure according to a fifth embodiment of the invention. In the embodiment, components the same as that of the first embodiment are represented by the same reference numbers, and are not repeated again.

Figure 5A:
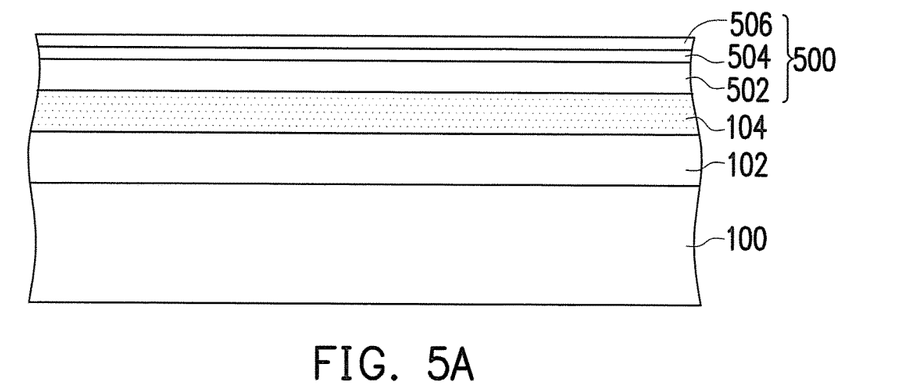
FIG. 5A to FIG. 5E are schematic cross-sectional views illustrating a manufacturing process of an isolation structure according to a fifth embodiment of the invention.

First, referring to FIG. 5A, the oxide layer 102, hard mask layers 104 and 500 are sequentially formed on the substrate 100. In the embodiment, the hard mask layer 500 is composed of an amorphous carbon layer 502, a dielectric anti-reflection coating 504, and a bottom anti-reflective coating 506 sequentially stacked, for example.

Figure 5B:
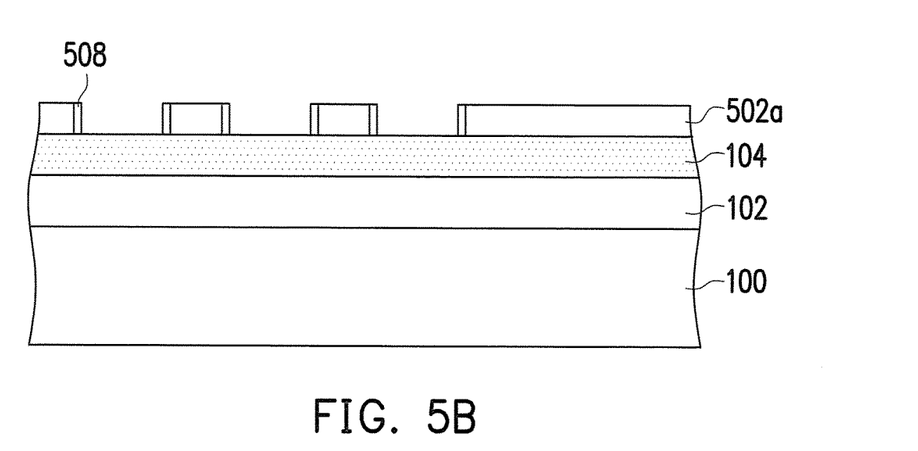

Then, referring to FIG. 5B, a patterning process is performed. The hard mask layer 500 is patterned to form a patterned hard mask layer 500 including a patterned amorphous carbon layer 502a, a patterned dielectric anti-reflection coating 504, and a patterned bottom anti-reflective coating 506, so as to expose a surface of the hard mask layer 104. Next, the patterned dielectric anti-reflection coating 504 and the patterned bottom anti-reflective coating 506 are removed, and the patterned amorphous carbon layer 502a is maintained on the hard mask layer 104. After that, spacers 508 are formed on sidewalls of the patterned amorphous carbon layer 502a. A material of the spacers 508 is an oxide material, for example, and a forming method thereof is that, a spacer material layer is conformally formed on the substrate 100 first, and then an anisotropic etching process is performed, for example. A thickness of the spacers 508 depends on a width of a specific trench subsequently formed in the substrate 100.

Figure 5C:
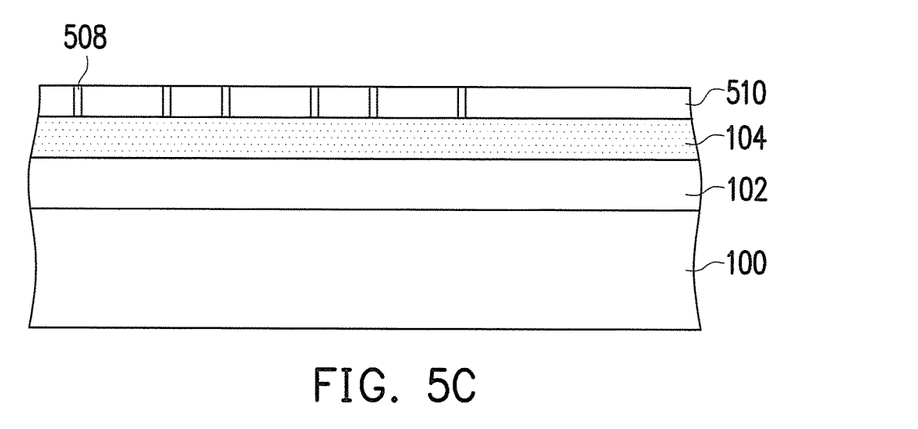

Next, referring to FIG. 5C, the patterned amorphous carbon layer 502a is removed. Then, a hard mask layer 510 is formed between the spacers 508. The hard mask layer 510 is a nitride layer, for example, and a forming method thereof is that, a hard mask material layer covering the spacers 508 is formed on the hard mask layer 104 first, and then an etching process is performed to remove a portion of the hard mask material layer until a top surface of the spacers 508 is exposed, for example.

Figure 5D:
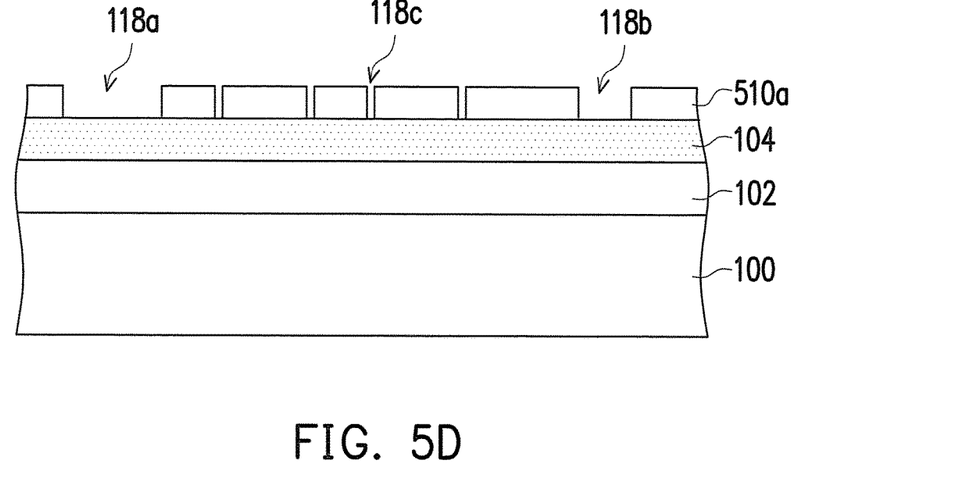

Then, referring to FIG. 5D, an etching process is performed to remove the spacers 508. Then, a patterning process is performed to remove a portion of the hard mask layer 510, so as to form a patterned hard mask layer 510a and the trench patterns 118a, 118b, and 118c with different widths.

Figure 5E:
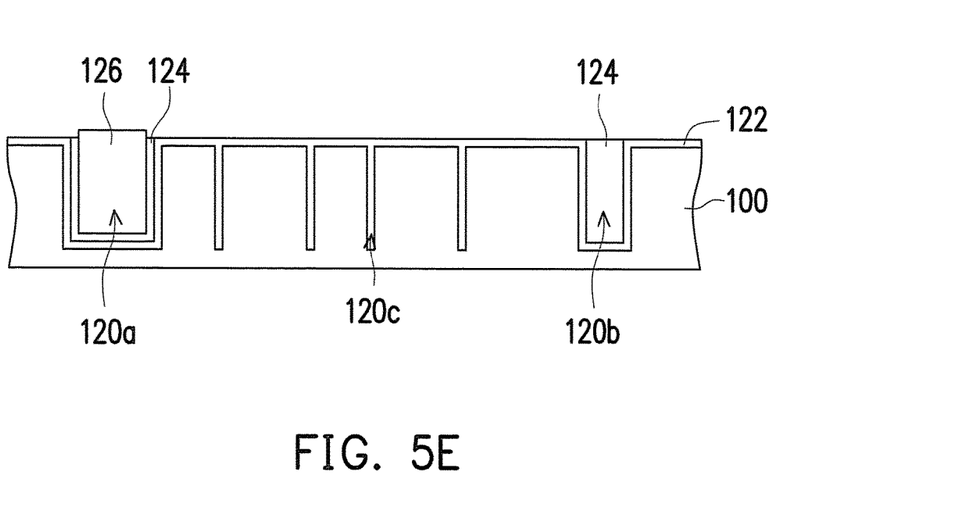

Thereafter, referring to FIG. 5E, the manufacturing process steps as described with reference to FIG. 1H to FIG. 1I are performed, so as to form the structure as shown in FIG. 1I.

FIG. 6A to FIG. 6G are schematic cross-sectional views illustrating a manufacturing process of an isolation structure according to a sixth embodiment of the invention. In the embodiment, components the same as that of the third embodiment are represented by the same reference numbers, and are not repeated again.

Figure 6A:
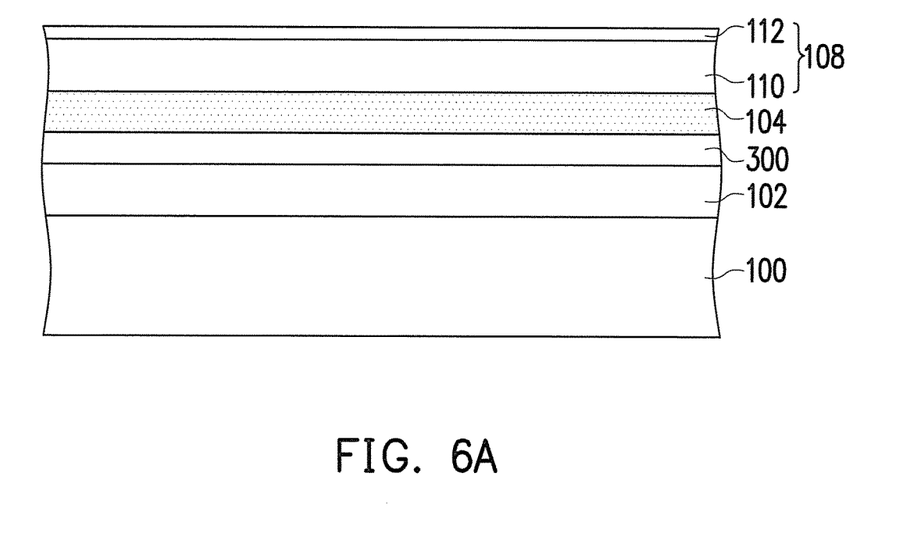
FIG. 6A to FIG. 6G are schematic cross-sectional views illustrating a manufacturing process of an isolation structure according to a sixth embodiment of the invention.

First, referring to FIG. 6A, the oxide layer 102, hard mask layers 300, 104, and 108 are sequentially formed on the substrate 100.

Figure 6B:
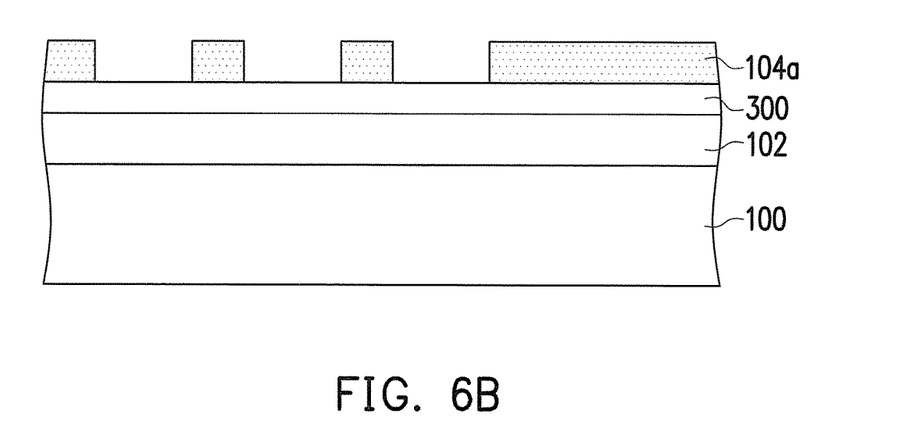

Then, referring to FIG. 6B, a patterning process is performed. The hard mask layer 108 is patterned to form a patterned hard mask layer 108, so as to expose a surface of the hard mask layer 104. Then, an etching process is performed using the patterned hard mask layer 108 as a patterning mask to remove the portion of the hard mask layer 104, so as to form the patterned hard mask layer 104a. Thereafter, the patterned hard mask layer 108 is removed.

Figure 6C:
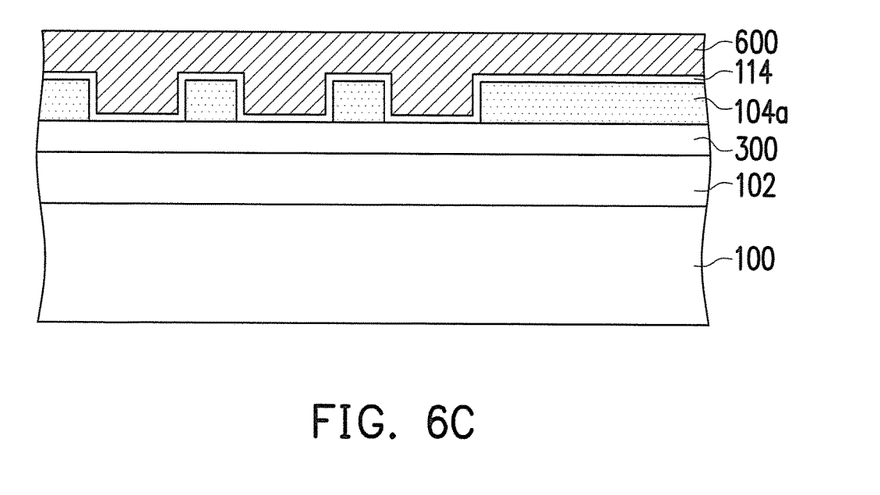

Next, referring to FIG. 6C, the oxide layer 114 is conformally formed on the substrate 100. A thickness of the oxide layer 114 depends on a width of a specific trench subsequently formed in the substrate 100. Then, a mask material layer 600, which fills the space exposed by the patterned hard mask layer 104a, is formed on the oxide layer 114. The mask material layer 600 is an organic dielectric layer, for example.

Figure 6D:
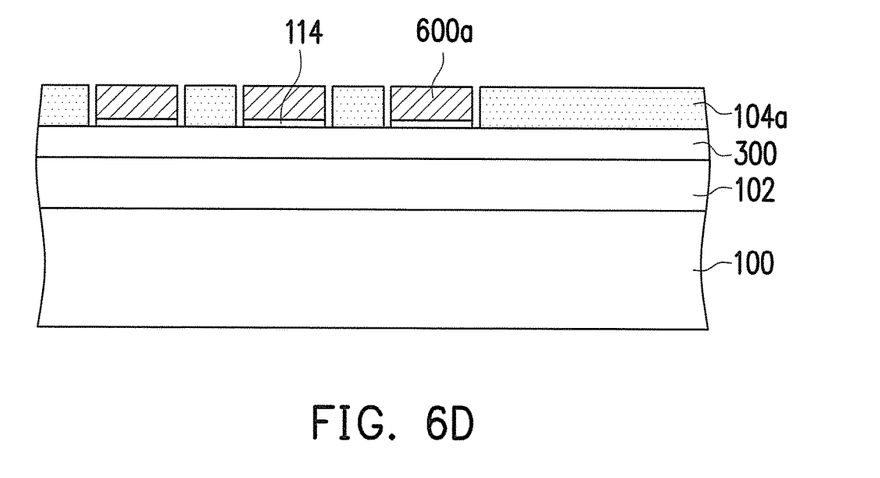

Then, referring to FIG. 6D, a portion of the mask material layer 600 and a portion of the oxide layer 114 are removed until the oxide layer 114 on the top surface of the patterned hard mask layer 104a is exposed, so as to form a patterned mask material layer 600a, and the oxide layer 114 located on the sidewalls of the patterned hard mask layer 104a is maintained to be used as a spacer. Then, an etching process is performed to remove a portion of the oxide layer 114, and the oxide layer 114 located below the patterned mask material layer 600a is maintained.

Figure 6E:
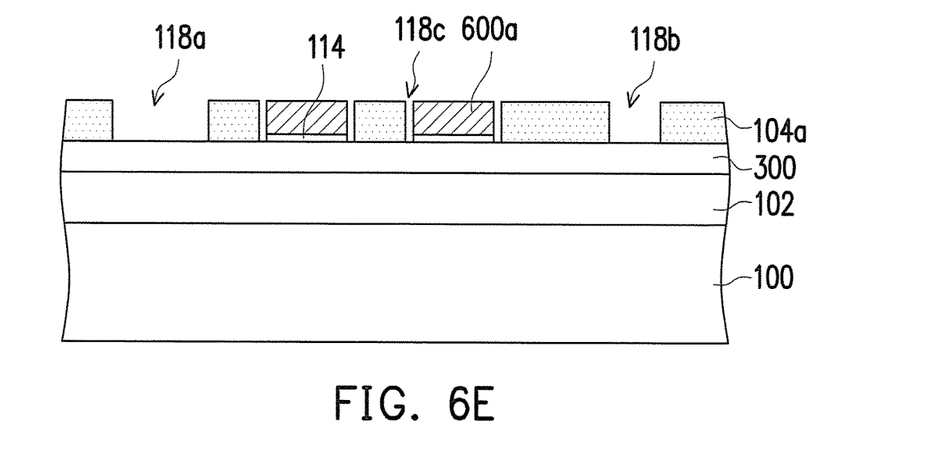

Then, referring to FIG. 6E, a patterning process is performed to remove a portion of the patterned hard mask layer 104a, so as to form the trench patterns 118a, 118b, and 118c with different widths.

Figure 6F:
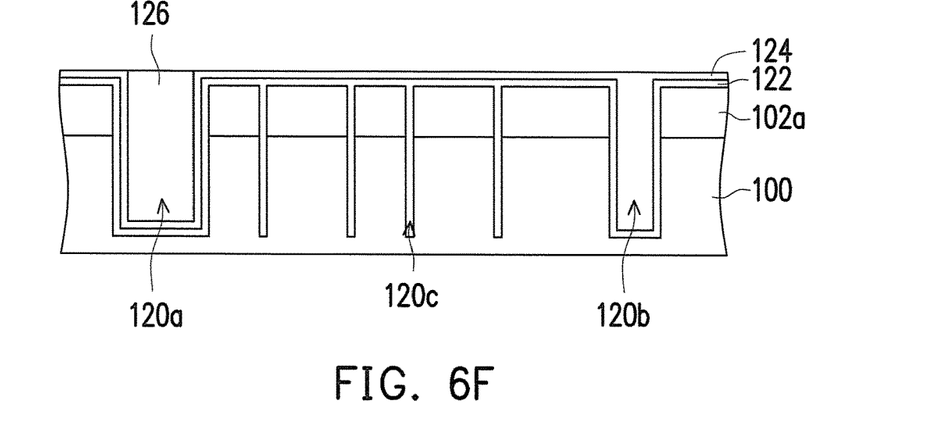

Then, referring to FIG. 6F, an etching process is performed using the patterned hard mask layer 104a and the patterned hard mask layer 600a as a patterning mask to remove a portion of the hard mask layer 300, a portion of the oxide layer 102, and a portion of the substrate 100, so as to form a patterned hard mask layer 300 and a patterned oxide layer 102a, and form the trenches 120a, 120b, and 120c with different widths in the substrate 100. Next, the patterned hard mask layer 104a, the patterned hard mask layer 600a, and the patterned hard mask layer 300 are removed. Since the patterned oxide layer 102a is covered by the patterned hard mask layer 300 thereon, the patterned oxide layer 102a can keep good quality. Therefore, after the patterned hard mask layer 300 is removed, the patterned oxide layer 102a can be maintained on the substrate 100, which can be used as a gate oxide layer of a semiconductor device subsequently formed. Certainly, in other embodiments, after the patterned hard mask layer 300 is removed, the patterned oxide layer 102a can also be removed. Then, the manufacturing process step as described with reference to FIG. 1F is performed to form the isolation materials 122, 124, and 126.

Figure 6G:
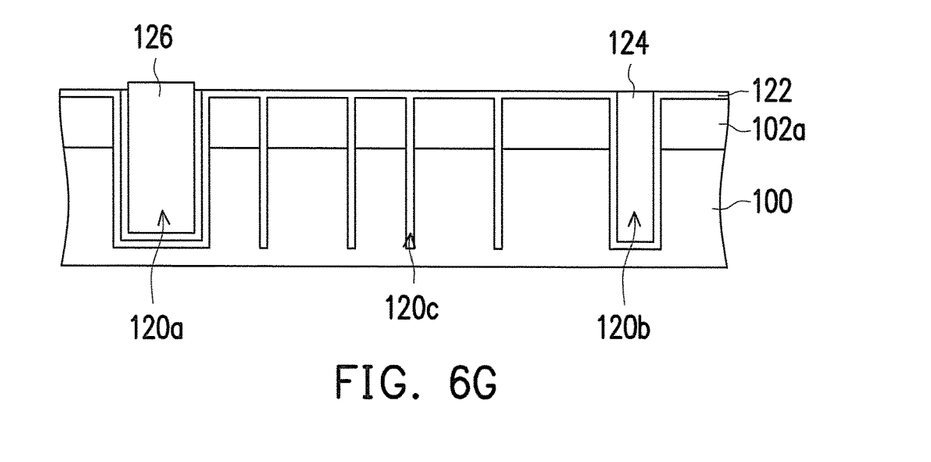

Thereafter, referring to FIG. 6G, as the manufacturing process step described with reference to FIG. 1I, an etching process is performed to remove a portion of the isolation material 124, and only the isolation material 124 in the trenches 120a and 120b is maintained. In the embodiment, since the thickness of the isolation material 124 covering on the surface of the patterned oxide layer 102a is quite thin, the isolation material 126 located in the trench 120a only slightly protrudes from the top surface of the substrate 100 after removing the isolation material 124 on the surface of the patterned oxide layer 102a. Therefore, the substrate 100 can exhibit a flat or substantially flat (i.e., a slight difference in height can be ignored) appearance, which is conducive to the following manufacturing process.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of fabricating an isolation structure, comprising:
    forming a first oxide layer, a first hard mask layer, a second hard mask layer, and a third hard mask layer on a substrate sequentially;
    forming a patterned third hard mask layer, so as to expose a surface of the second hard mask layer;
    forming second oxide layers on sidewalls of the patterned third hard mask layer and forming a fourth hard mask layer between the second oxide layers;
    removing the second oxide layers and the second hard mask layer thereunder using the patterned third hard mask layer and the fourth hard mask layer as a patterning mask, so as to form a patterned second hard mask layer;
    after forming the patterned second hard mask layer, removing the patterned third hard mask layer and the fourth hard mask layer;
    removing a portion of the patterned second hard mask layer, so as to form trench patterns with different widths;
    defining a patterned first hard mask layer, a patterned first oxide layer, and trenches with different widths located in the substrate using the patterned second hard mask layer as a patterning mask;
    removing the patterned second hard mask layer, the patterned first hard mask layer, and the patterned first oxide layer; and
    forming isolation materials in the trenches;
    wherein the first hard mask layer is an amorphous silicon layer, the second hard mask layer is an oxide layer, the third hard mask layer comprises an amorphous carbon layer, a dielectric anti-reflection coating, and a bottom anti-reflective coating sequentially stacked, and the fourth hard mask layer is an organic dielectric layer.

* * * * *